United States Patent
Nogami et al.

Patent Number: 6,043,153
Date of Patent: Mar. 28, 2000

[54] METHOD FOR REDUCING ELECTROMIGRATION IN A COPPER INTERCONNECT

[75] Inventors: Takeshi Nogami, Sunnyvale; Simon Chan, Saratoga, both of Calif.

[73] Assignee: Advanced Micro Devices, Inc., Sunnyvale, Calif.

[21] Appl. No.: 08/937,915

[22] Filed: Sep. 25, 1997

[51] Int. Cl.[7] ..................................... H01L 21/44
[52] U.S. Cl. .................. 438/687; 438/627; 438/643; 438/675
[58] Field of Search ..................... 438/627, 643, 438/648, 687, 688, 634, 637, 675

[56] References Cited

U.S. PATENT DOCUMENTS

| | | | |
|---|---|---|---|
| 5,656,858 | 8/1997 | Kondo et al. | 257/737 |
| 5,714,418 | 2/1998 | Bai et al. | 438/627 |
| 5,736,458 | 4/1998 | Teng | 438/627 |
| 5,814,557 | 9/1998 | Venkatraman et al. | 438/622 |

*Primary Examiner*—Charles Bowers
*Assistant Examiner*—Reneé R. Berry
*Attorney, Agent, or Firm*—Sawyer & Associates

[57] ABSTRACT

A system and method for providing copper interconnect in a trench formed in a dielectric is disclosed. In one aspect, the method and system include providing a copper layer; removing a portion of the copper layer outside of the trench; annealing the copper layer; and providing a layer disposed above the copper layer. In another aspect, the method and system include providing a copper interconnect formed in a trench on a dielectric. The copper interconnect includes a copper layer disposed in the trench and a layer disposed above the copper layer. The copper layer has a bamboo structure at least one grain. The at least one grain has substantially one orientation.

8 Claims, 4 Drawing Sheets

METHOD FOR REDUCING ELECTROMIGRATION IN A COPPER INTERCONNECT

FIELD OF THE INVENTION

The present invention relates to formation of copper interconnects and more particularly to a method and system for providing a copper interconnect having higher resistance to electromigration.

BACKGROUND OF THE INVENTION

Copper interconnects can be utilized to carry electricity in microcircuits. Copper is, however, subject to electromigration. Electromigration can degrade the performance of copper interconnects, for example by aiding the growth of voids in the interconnect. As a result, copper interconnects may be more subject to failure. The resistance of copper to electromigration is strongly dependent upon the crystal structure of the copper interconnect.

Conventional processing of copper interconnects can include an annealing step used to control the crystal structure of the copper. The structure and grain size of the copper depends upon when annealing takes place. One conventional method for processing copper interconnects anneals the interconnect after the copper film is deposited and before polishing removes excess copper. This annealing step can result in the formation of grain boundaries which have grain boundary triple points through the interconnect. A grain boundary triple point is an intersection of grain boundaries. It is known that grain boundaries are paths of high diffusion for copper atoms. It is also known that the grain boundaries with grain boundary triple points are sites for high electromigration because the grain boundary triple points connect paths of high diffusion. As a result, a copper interconnect formed by this process is subject to relatively high electromigration.

A second conventional method for processing copper interconnects anneals the interconnect after the copper film has been polished and passivated. As a result, the copper interconnect may have grain boundaries with very few grain boundary triple points. When copper has this structure, it is said to have a bamboo structure. Consequently, electromigration due to grain boundaries having grain boundary triple points is reduced. However, the orientation of the grains is not controlled. As a result, some grain boundaries have a high defect density and are likely to be high diffusion paths. As a result, the copper interconnect is still subject to electromigration.

Accordingly, what is needed is a system and method for providing a copper interconnect having reduced electromigration. The present invention addresses such a need.

SUMMARY OF THE INVENTION

The present invention provides a method and system for providing copper interconnect. In one aspect, the method and system comprise providing a copper interconnect in a trench formed in a dielectric. In this aspect, the method and system comprise providing a copper layer; removing a portion of the copper layer outside of the trench; annealing the copper layer; and providing a layer disposed above the copper layer. In another aspect, the method and system comprise providing a copper interconnect formed in a trench in a dielectric. The copper interconnect comprises a copper layer disposed in the trench and a layer disposed above the copper layer. The copper layer has a bamboo structure and at least one grain. The at least one grain has substantially one orientation.

According to the system and method disclosed herein, the copper interconnect has higher resistance to electromigration, thereby increasing overall system performance.

DESCRIPTION OF THE INVENTION

The present invention relates to an improvement in the formation of copper interconnects. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
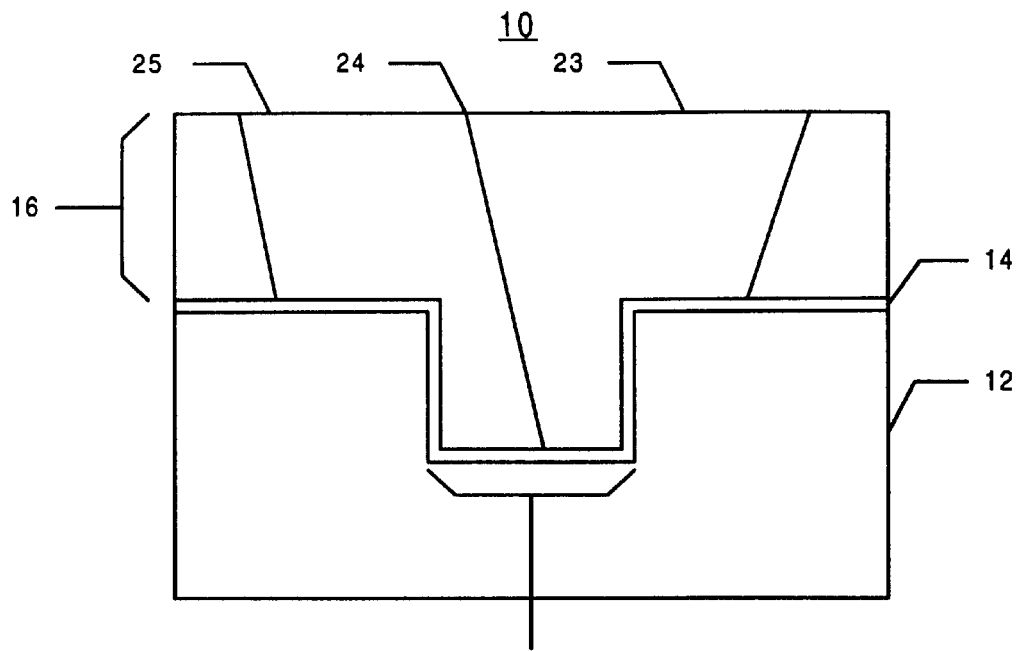
FIG. 1A is a cross-section of a copper interconnect formed using a first conventional annealing process after annealing.

FIG. 1A is a cross-section of a conventional copper interconnect 10 after annealing has been performed. Typically, a trench 13 is provided in a dielectric 12. A barrier metal layer 14 is then deposited. A copper film 16 is then deposited, for example by plating copper to the barrier metal layer 14. The barrier metal layer 14 reduces the diffusion of copper in the copper film 16 into the dielectric 12.

Copper is subject to electromigration. Electromigration can degrade the performance of copper interconnects, for example by aiding the growth of voids in the interconnect. As a result, copper interconnects may be more subject to failure. The resistance of copper to electromigration is strongly dependent upon the crystal structure of the copper interconnect. The crystal structure, including the grain size, depends upon any annealing during processing. Consequently, annealing is performed to control the crystal structure of the copper film 16.

Figure 1B:
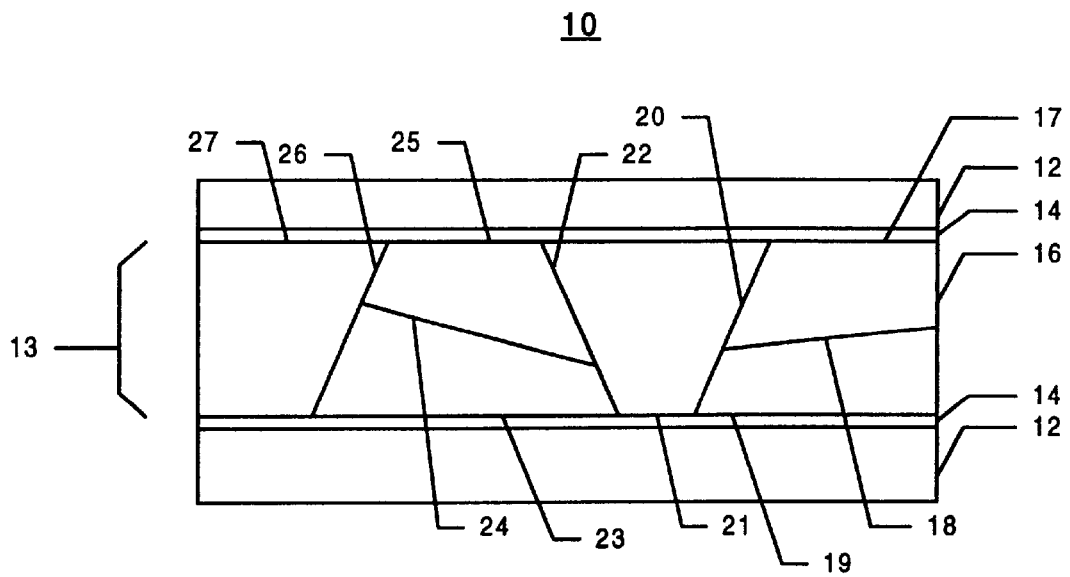
FIG. 1B is a longitudinal view of the copper interconnect formed using a first conventional annealing process after polishing.

In the interconnect 10 depicted in FIG. 1A, annealing has been performed after the copper film 16 is deposited and before polishing removes excess copper. Because the copper interconnect 10 is annealed prior to polishing, the copper layer 16 is very thick. As a result, grains 23 and 25 are formed during annealing. Refer now to FIG. 1B depicting a longitudinal view of the copper interconnect 10 taken from above. As shown in FIG. 1B, the interconnect 10 has grains 17, 19, 21, 23, 25, and 27 which are separated by grain boundaries 18, 20, 22, 24, and 26. The grain boundary 24 intersects grain boundaries 22 and 26. The grain boundary 18 also intersects the grain boundary 20. These intersections are known as a grain boundary triple points. When copper has grain boundaries which have almost no grain boundary triple points, the copper is said to have a bamboo structure. Because the copper layer 16 has many grain boundary triple points, the copper layer 16 does not have a bamboo structure.

Although the copper interconnect 10 can function, one of ordinary skill in the art will readily realize that the grain boundaries 18, 20, 22, 24, and 26 are high diffusion paths for copper atoms. Copper atoms preferentially diffuse along the grain boundaries 18, 20, 22, 24, and 26. A void is likely to be formed at the grain boundaries 18, 20, 22, 24, and 26. The grain boundary triple points connect these grain boundaries. Because of the connection between the grain boundaries, the diffusion can occur not only along an individual grain boundary 18, 20, 22, 24, or 26, but can also spread to other grain boundaries 18, 20, 22, 24, and 26. As a result, a copper interconnect 10 formed by this process is highly subject to electromigration.

Figure 2A:
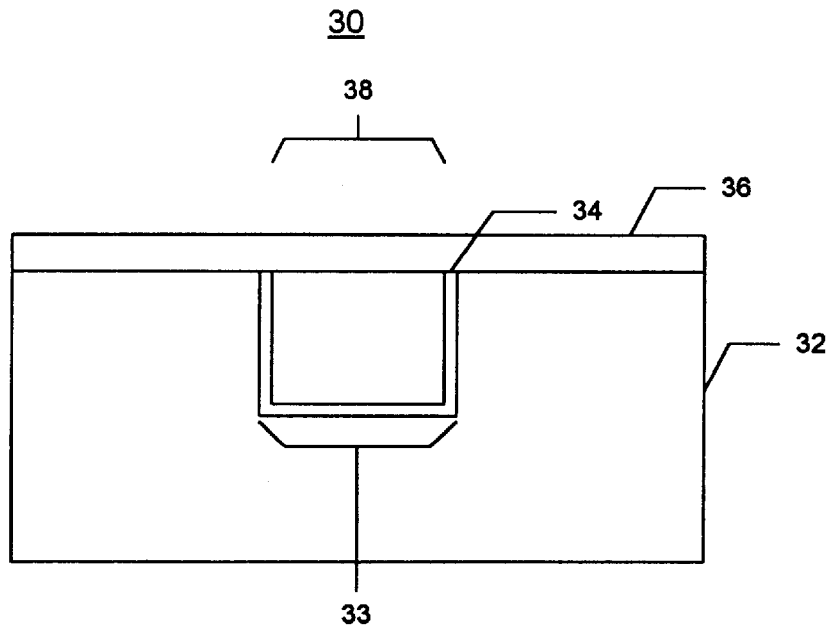
FIG. 2A is a cross-section of a copper interconnect formed using a second conventional annealing process.
Figure 2B:
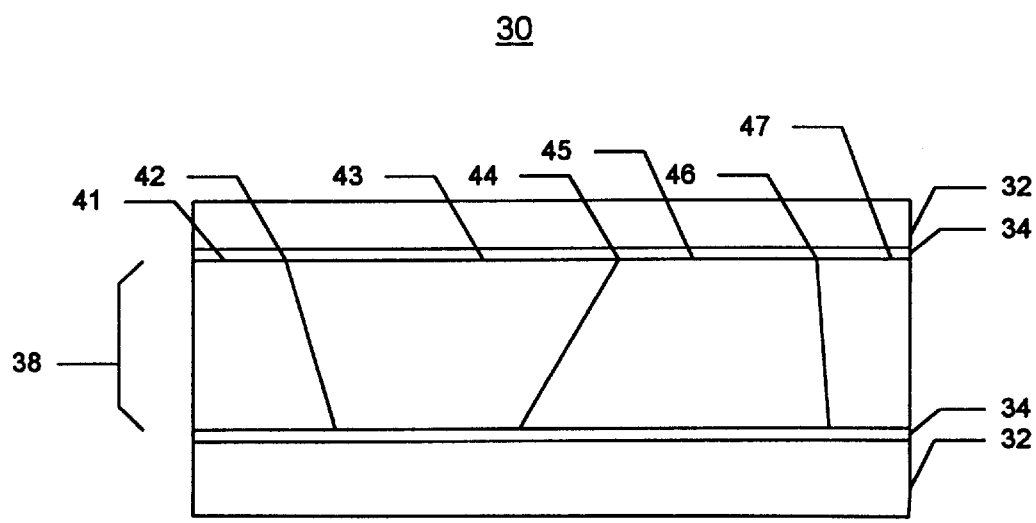
FIG. 2B is a longitudinal view of the copper interconnect formed using a second conventional annealing process.

FIGS. 2A and 2B depict a copper interconnect 30 made in accordance with a second conventional method. FIG. 2A is a cross-sectional view of the copper interconnect 30. FIG. 2B is a longitudinal view from above of the copper interconnect 30. After the trench 33 is formed in the dielectric 32, a barrier metal layer 34 is deposited. A copper layer 38 is provided. The copper interconnect 30 is then polished to remove the portion of the copper layer 38 outside of the trench 33. The copper layer 38 is then passivated by providing a dielectric layer 36. The copper interconnect 38 is then annealed. Passivation is performed prior to annealing to ensure that annealing can easily be accomplished without concern over oxidation or other contamination of the copper layer 38. The copper layer 38 may have a bamboo structure after annealing. The grain boundaries 42, 44 and 46 have almost no grain boundary triple points. The copper interconnect 30 may have reduced electromigration due to diffusion along connected grain boundaries. The electromigration is thereby reduced.

Although the electromigration along grain boundaries is reduced, one of ordinary skill in the art will readily realize that the orientation of the copper layer 38 is not controlled. Because neighboring grains may have differing orientations, the defect density on a grain boundary may be high. Grains having the same orientation are less subject to electromigration. For example, a copper crystal having a (111) orientation is more resistant to electromigration because there are fewer defects along the grain boundaries. Because of the presence of the dielectric layer 36, the copper layer 38 will not preferentially grow with a particular orientation, such as the (111) orientation. The copper interconnect 30 is, therefore, still subject to electromigration.

The present invention provides for a method and system for providing a copper interconnect having greater resistance to electromigration. The present invention will be described in terms of a copper interconnect grown using a particular annealing temperature and annealing at a particular time in processing. However, one of ordinary skill in the art will readily recognize that this method and system will operate effectively for other annealing temperatures or annealing at another time in processing of the copper interconnect. In addition, the present invention will be described in terms of grains having a particular orientation. However, one of ordinary skill in the art will readily recognize that this method will operate effectively for other orientations.

Figure 3:
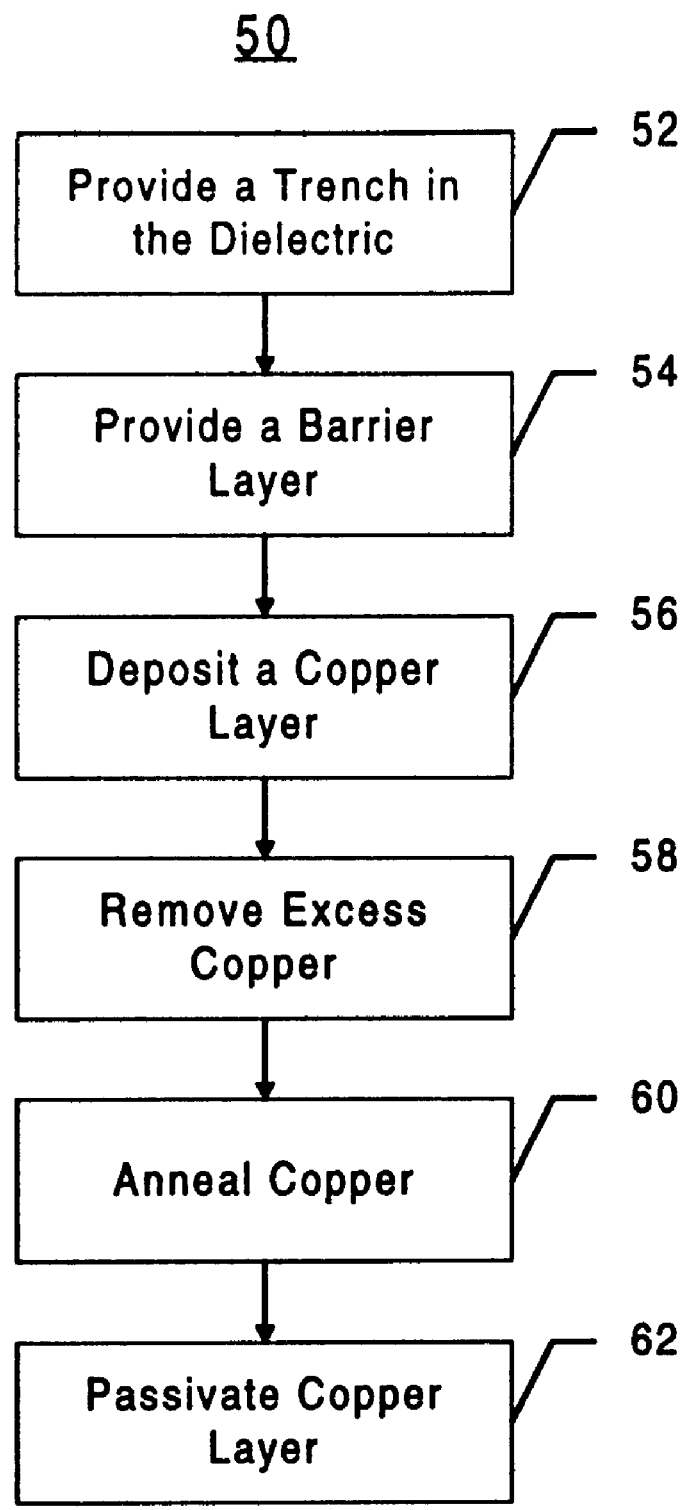
FIG. 3 is a flow chart depicting one embodiment of a method for providing a copper interconnect in accordance with the present invention.

To more particularly illustrate the method and system in accordance with the present invention, refer now to FIG. 3 depicting a method 50 for forming a copper interconnect in accordance with the present invention. First, a trench is formed in the dielectric via step 52. In a preferred embodiment, the dielectric is silicon dioxide. A barrier metal layer is then provided via step 54 to prevent the diffusion of copper into the dielectric. A copper layer is then deposited in step 56. The excess portion of the copper layer outside of the trench is then removed in step 58. After removal of the excess copper, the interconnect is annealed in step 60. In a preferred embodiment, annealing is performed at a temperature of about 350–400 degrees Celsius. Also in a preferred embodiment, the annealing is performed in hydrogen gas. In another embodiment, annealing is performed in a vacuum. However, any combination of annealing gases which preclude oxidation of the copper layer are sufficient. The copper is then passivated, if required, in step 62. Note that only relevant steps in the method 50 have been described. Nothing prevents the method and system from use with a different number or different order of steps, as long as the desired structure is achieved.

Figure 4A:
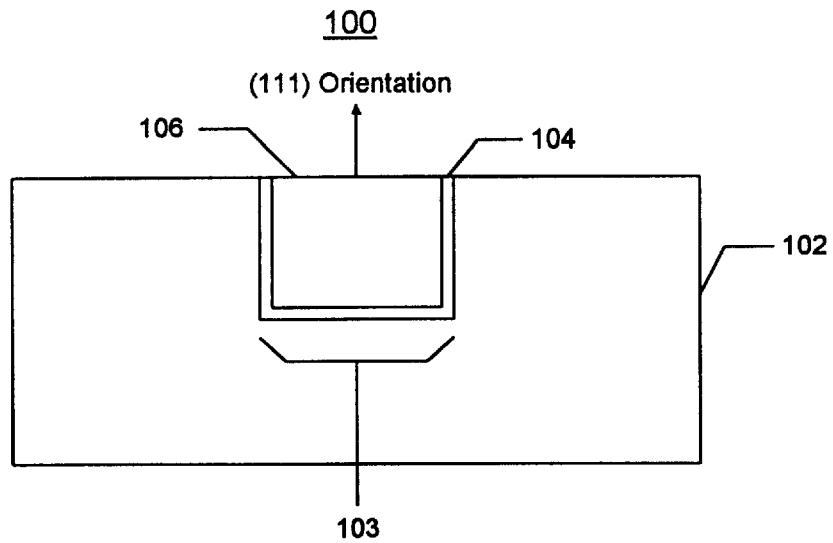
FIG. 4A is a cross-section of a copper interconnect formed in accordance with the method and system.
Figure 4B:
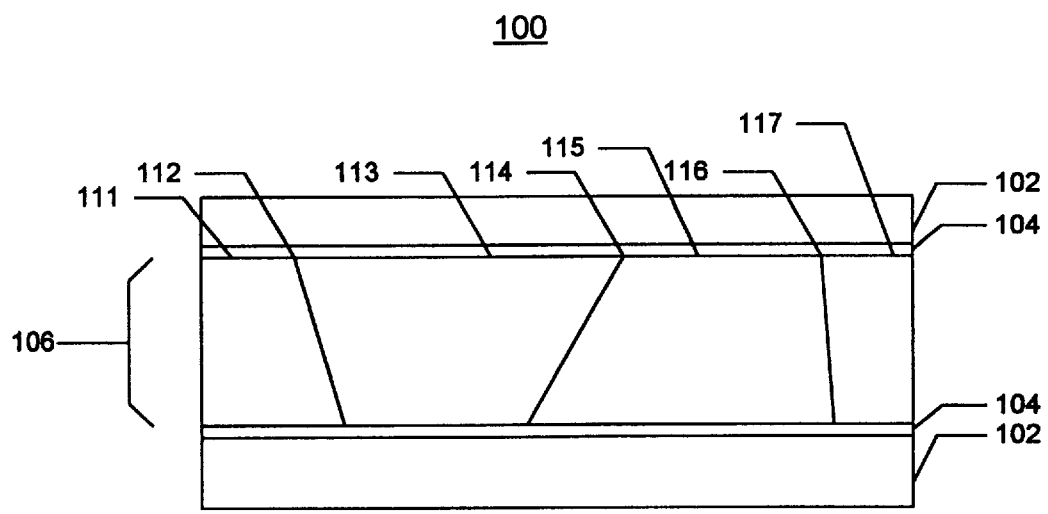
FIG. 4B is a longitudinal view of the copper interconnect formed in accordance with the method and system.

Refer now to FIGS. 4A and 4B depicting one embodiment of a copper interconnect 100 formed in accordance with the method 100. FIG. 4A is a cross-sectional view of the copper interconnect 100. FIG. 4B is a longitudinal view of the copper interconnect 100 from above. The copper interconnect 100 is depicted after annealing step 60. The copper interconnect 100 includes a trench 103 in the dielectric 102. A barrier metal layer 104 prevents the diffusion of copper into the dielectric 102. A copper layer 106 has been annealed as discussed with respect to FIG. 3.

The copper layer 106 has a bamboo structure as shown by the grain boundaries 112, 114, and 116. The grains 111, 113, 115, and 117 of the copper layer 106 have a (111) orientation because annealing was performed after removal of excess copper (not shown) outside of the trench 103. The top surface of the copper layer 106 is free during annealing. Because a free surface exists during annealing, the surface energy of the copper layer 106 will be minimized during annealing. A (111) orientation minimizes the free surface energy. As a result, the copper layer 106 will have a (111) orientation. Thus, the copper interconnect 100 will have a copper layer 106 that has both a bamboo structure and a (111) orientation.

Because there are essentially no grain boundary triple points, diffusion starting on a grain boundary will be restricted to that grain boundary. In addition, the grain boundaries 112, 114, and 116 have a very small defect density. The grain boundaries 112, 114, and 116 have a small defect density because grains along the grain boundaries 112, 114, and 116 share the same orientation. Consequently, the copper layer 106 is less subject to diffusion along a grain boundary. Thus, the copper interconnect 100 is more resistant to electromigration and more reliable.

A method and system has been disclosed for providing a copper interconnect having reduced susceptibility to electromigration.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a copper interconnect in a trench formed in a dielectric, the method comprising the sequential steps of:

providing a copper layer;

removing a portion of the copper layer outside of the trench;

annealing the copper layer; and providing a layer disposed above the copper.

2. The method of claim 1 further comprising the step of:

providing a barrier layer, the barrier layer being disposed between the copper layer and the dielectric.

3. The method of claim 2 wherein the step of annealing the copper layer further comprises the step of:

annealing the copper layer in a non-oxidizing ambient.

4. The method of claim 3 wherein the non-oxidizing ambient further comprises vacuum.

5. The method of claim 3 wherein the non-oxidizing ambient further comprises hydrogen.

6. The method of claim 5 wherein the layer providing step further comprises the step of:

providing a dielectric layer disposed above the copper layer.

7. The method of claim 6 wherein the step of annealing the copper layer further comprises the step of:

annealing the copper layer within a temperature range, the temperature range being between approximately three hundred fifty and approximately four hundred degrees Celsius.

8. A method for providing a copper interconnect in a trench formed in a dielectric, the method comprising the steps of:

(a) providing a copper layer;

(b) removing a first portion of the copper layer outside of the trench; and (c) treating the copper layer to ensure that a second portion of the copper layer within the trench has a bamboo structure and that the second portion of the copper layer has substantially one orientation.

\* \* \* \* \*